United States Patent [19]
Etienne

[11] Patent Number: 5,844,173
[45] Date of Patent: Dec. 1, 1998

[54] COLLECTOR TERMINAL FOR CONTACT WITH A BATTERY SUPPLYING AN ELECTRONIC CIRCUIT, AND AN ELECTRONIC CIRCUIT AND A RADIO REMOTE CONTROL EMITTER INCORPORATING SUCH A TERMINAL

[75] Inventor: Denis Etienne, Montrouge, France

[73] Assignee: Valeo Electronique, Creteil Cedex, France

[21] Appl. No.: 510,780

[22] Filed: Aug. 3, 1995

[30] Foreign Application Priority Data

Aug. 4, 1994 [FR] France .................................. 94 09720

[51] Int. Cl.⁶ ...................................................... H05K 1/00
[52] U.S. Cl. ........................... 174/250; 174/260; 174/261
[58] Field of Search .................................... 361/767, 768, 361/777, 775, 796, 778, 781; 257/739; 174/261, 250, 260; 200/5 A, 512, 515, 1 B

[56] References Cited

U.S. PATENT DOCUMENTS

| | | | |
|---|---|---|---|
| 2,758,256 | 8/1956 | Eisler ....................................... | 317/101 |
| 3,308,355 | 3/1967 | Davis, Jr. et al. ....................... | 317/236 |
| 3,594,885 | 7/1971 | Miram et al. ............................. | 445/47 |
| 3,851,223 | 11/1974 | Yonezuka et al. ............... | 317/101 CC |
| 3,992,227 | 11/1976 | Persson .................................. | 429/121 |
| 4,002,892 | 1/1977 | Zielinski ................................. | 200/5 A |
| 4,706,536 | 11/1987 | Sanders .................................. | 200/5 A |
| 5,024,605 | 6/1991 | Kasatani et al. ........................ | 439/500 |
| 5,426,266 | 6/1995 | Brown et al. ............................ | 174/267 |

FOREIGN PATENT DOCUMENTS

| | | |
|---|---|---|
| 413144 A1 A2 A3 | 2/1991 | European Pat. Off. . |
| 580886 | 2/1994 | European Pat. Off. . |
| 3116348 | 9/1982 | Germany . |
| 4141270 | 6/1993 | Germany . |
| 1232657 | 9/1989 | Japan . |
| 240857 | 9/1990 | Japan . |

OTHER PUBLICATIONS

Motorola Technical Development, Vo.. 19, Jun. 1993, Schaumburg, IL.

Research Disclosure No. 158, Jun. 1977 Havant GB, Jeffrey Richard Stoneham.

French Search Report dated 19 May 1995.

*Primary Examiner*—Kristine Kincaid
*Assistant Examiner*—Kristina Soderquist
*Attorney, Agent, or Firm*—Morgan & Finnegan, LLP

[57] ABSTRACT

A collector terminal is arranged to make electrical contact between a voltage source such as a battery and an electronic circuit, whereby the latter is supplied with power by the battery. The battery is placed, or pressed, against the collector terminal in order to obtain the required contact. The electronic circuit is typically that of a hand-held remote control unit for operating a central locking system of a motor vehicle. The occurrence of unsuccessful attempts, by a user, to obtain a remote control signal from the control unit, is reduced by improving the contact between the battery and the collector terminal. The collector terminal is substantially flat and includes a grid structure defining recesses in its contact surfaces. The apex or projecting point of a convex surface zone of the battery, existing at least locally around this apex, enters into a recess between two teeth forming part of the grid network, thus increasing the number of points of contact.

10 Claims, 2 Drawing Sheets

COLLECTOR TERMINAL FOR CONTACT WITH A BATTERY SUPPLYING AN ELECTRONIC CIRCUIT, AND AN ELECTRONIC CIRCUIT AND A RADIO REMOTE CONTROL EMITTER INCORPORATING SUCH A TERMINAL

FIELD OF THE INVENTION

This invention relates to a collector terminal for making contact with a voltage source, for example one or more batteries, to supply an electronic circuit with power. The invention further relates to an electronic circuit incorporating such a terminal; and to a remote control emitter, or remote control unit, incorporating such a terminal.

The invention is applicable to all those technical fields in which an electronic circuit is supplied with power by a self-contained battery, but more especially to the field of remote control units for motor vehicles.

BACKGROUND OF THE INVENTION

In the current state of the art, remote control systems conventionally include a central receiver unit for receiving a control signal, which may be either coded or not coded. The purpose of the receiver unit is, for example, to actuate a central locking system of a vehicle, or, in more general terms in the context of a vehicle, to lock or unlock at least one openable element of the vehicle, such as a door, hood, trunk or tailgate. The control signal is emitted from a remote control unit operated by the user of the vehicle.

The remote control unit comprises a housing containing an electronic emitter circuit for generating and transmitting the emission signal constituting the control signal. This electronic circuit is supplied with power by a small dry battery which is generally in the familiar form of a flat, circular tablet.

It is known to locate the battery underneath the electronic circuit, on a flat, circular collector terminal which is, for example, made of silvered copper. The housing is made so that it can be opened and closed, and once it is closed the components within the housing are held together so that there is a permanent contact between the battery and the collector terminal.

In addition, below a zone of the housing on which the user presses a finger in order to generate and send the control signal, there is an interrupter of the push-button type, for completing the electrical circuit that comprises the battery and the electronic emitter circuit, thereby causing the control signal to be generated and sent.

It is found in practice that the finger pressure exerted by the user on the above mentioned zone of the housing lying above the interrupter is often not large enough to enable the control signal to be emitted at all. This operating fault is often due to poor electrical contact between the battery and its collector terminals. This poor contact is, in turn, attributed to corrosion of the zones of contact between the battery and the corresponding collector terminal of the electronic circuit. The user then suffers the inconvenience of seeing his action failing to achieve the expected result, namely opening or closing of the vehicle; and he has then to make another attempt. This may have to be repeated several times before the mechanical forces exerted on the remote control unit disperse the corrosion sufficiently to enable the lost contact to be restored.

This problem can be extremely inconvenient if the contact loss occurs when the user leaves the vehicle and tries to lock it without success. In this connection, if the locking operation is not completed and the user does not notice, the vehicle may be inadvertently left unlocked.

In practice, the surface of the battery is never perfectly flat. On the contrary, there is some curvature in the surface through which it makes physical contact with the corresponding collector terminal of the electronic circuit. This can be explained in more detail with reference to FIG. 1 of the accompanying drawings, which represents the current state of the art in this connection.

As can be seen in FIG. 1, a battery 10 has a lower surface 11 which typically corresponds to the negative pole of the battery. The surface 11 can, at least locally around a point 12, constitute a convex surface, that is to say one which is curved outwardly. When the battery is fitted and retained in position, being pressed against a contact zone 13 in which it makes contact with an electronic circuit (not shown in FIG. 1), the point 12 makes physical contact with the contact zone 13, and the required electrical contact should then be made.

The contact zone 13 is, as already mentioned, not perfectly plane, though it is shown plane in FIG. 1. The zone 13 is of silvered copper, and is made by any conventional method of making printed circuits or electronic circuit boards that is known to those skilled in the art. Thus the zone 13 has a surface which is not necessarily smooth or even.

It should be noted that FIG. 1 is diagrammatic and, in the interests of clarity, it shows only the lower surface of the battery with a curvature.

It will readily be understood that, because of the nature of the contact zones concerned, contact between the battery and the collector terminal is usually reduced in practice to point contact or substitute to point contact. This leads to poor quality in the electrical contact between the battery and the collector terminal, especially since this contact is highly susceptible to the effects of any corrosion of the contact zones.

It is known to try to make the contact zone between the lower surface 11 of the battery and the contact zone (or collector terminal) 13 of the electronic circuit as large as possible, either by using batteries as flat as possible and highly polished, or by expending much effort, during manufacture of the contact zone 13 of the electronic circuit, in trying to ensure that the working surface is as flat as possible. The desired result is to obtain as many contact points as possible.

However, it has been found that, in spite of the costly efforts made to obtain, in manufacture, the best possible quality of a housing which sealingly encloses the other components of the remote control unit, and which protects the contacts from corrosion, and the best possible quality of the actual contact zone 13 of the electronic circuit, the quality of the permanent contact obtained between the surface of the battery and the collector terminal is still not as good as is desirable.

DISCUSSION OF THE INVENTION

In order to overcome the drawbacks of the prior art discussed above, the present invention proposes a simple and reliable means whereby the number of fruitless applications of finger pressure by the user on the housing the remote control unit is greatly reduced.

According to the invention in a first aspect a collector terminal for making electrical contact with a voltage source such as a battery, for supplying an electronic circuit of the type comprising, in particular, electronic components and conductive strips connecting the electronic components to the collector terminal, the battery being placed and/or pressed against the collector terminal to establish the electrical contact, is characterised in that its surface is substantially flat and includes a grid structure defining recesses.

Thus, if a model of the battery surface is considered to have a convex profile, at least locally (as is shown in FIG. 1), its apex or projecting point 12 tends to be located within a recess in the grid structure. This at once provides physical and electrical contact between the battery and the collector terminal in a plurality of points around the projecting point 12.

According to a preferred feature of the invention, the grid is straight, with the grid being a substantially square grid, each recess therein being square.

According to another preferred feature of the invention it is disposed on a printed circuit which further includes the conductive strips, the collector terminal being formed at the same time as the said conductive strips.

According to a further preferred feature of the invention, the collector terminal and the conductive strips are made from an alloy of nickel and gold.

According to the invention in a second aspect, an electronic circuit of the type comprising at least one external supply source such as a battery, is also of the type formed on a printed circuit carrying conductive strips and electronic components. The printed circuit and the battery are protected by and contained in a closable housing. The printed circuit also carries at least one collector terminal according to the first aspect of the invention.

The electronic circuit preferably includes only one battery.

According to yet another preferred feature of the invention, the printed circuit has two collector terminals, namely a first terminal for contact with the negative pole of the battery, and a second terminal for contact with the positive pole of the battery.

Preferably, the battery is retained in a seating in the base of the closable housing, the contact between a first face of the battery and the first collector terminal being permanent.

According to a still further preferred feature of the invention, a first end of a collector tongue is disposed between the base of the housing and a second face of the battery, with which it makes permanent contact. A second end of the collector tongue is in permanent contact with the second collector terminal of the printed circuit.

According to the invention in a third aspect, a radio control emitter unit, of the type used for controlling the locking and unlocking of openable parts of a vehicle, is characterised in that it comprises an electronic circuit according to the invention in its second aspect.

Further features and advantages of the invention will appear more clearly from the detailed description of a preferred embodiment of the invention which follows, and which is given by way of example only and with reference to the accompanying drawings.

DESCRIPTION OF A PREFERRED EMBODIMENT OF THE INVENTION

Figure 2:
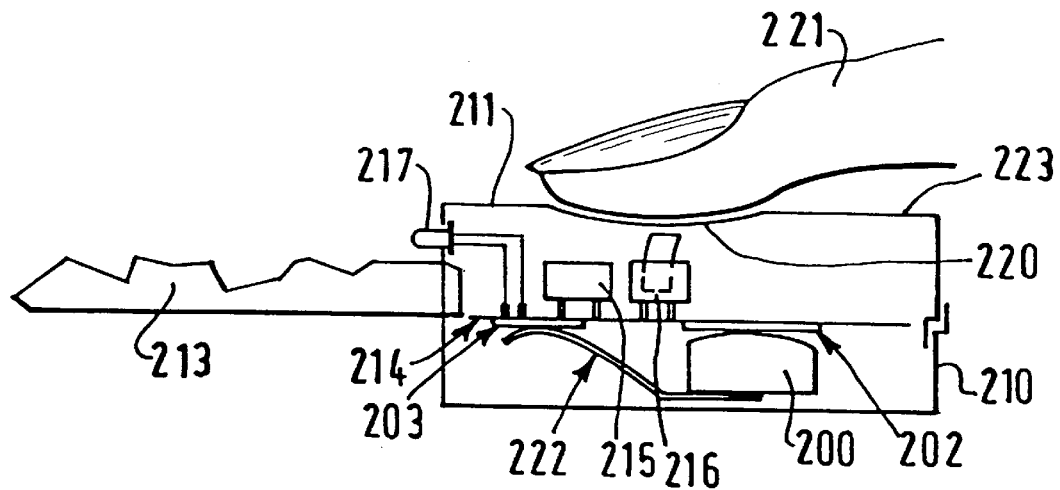
FIG. 2 shows a remote control unit, seen in cross section and illustrating the principle whereby the battery is brought into contact with the terminals of an electronic circuit.

Reference is first made to FIG. 2, which shows a remote radio control unit used for emitting a coded control signal for remotely opening doors and/or other openable parts of a motor vehicle. This unit includes a housing comprising a base 210 and a cover 211, which closes the base and seals the interior of the unit from the outside. The control unit forms the handle of a key, the conventional insert element 213 of which projects from the unit. This insert element 213 provides any of the usual key functions found in a motor vehicle, such as steering lock and starting the vehicle.

The control unit also comprises an electronic unit for emitting the coded control signal. A double-sided printed circuit 214 is disposed inside the housing of the unit, and carries electronic components 215, 216, together with an infra-red diode 217 for emitting the control signal itself. On its lower face, the printed circuit 214 has two collector terminals 202 and 203, for example a negative supply terminal and a positive supply terminal respectively of the electronic circuit.

The supply source is a battery 200, a first face of which (i.e. the upper face in FIG. 2), corresponding to the negative terminal 200, is arranged below the negative collector terminal 202 of the printed circuit. The battery 200 is secured in a seating (not shown) in the base 210 of the housing of the control unit. Between the base 210 of the housing and the lower face of the battery 200, there is a collector tongue 222, which is in permanent contact, firstly with the lower face of the battery, and secondly with the positive supply terminal 203 of the printed circuit 214. The permanent contact between the upper face of the battery 200 and, firstly, the negative supply terminal 202 and secondly the positive supply terminal 203, is obtained as a result of appropriate computation, during design of the unit, of the mechanical clearance.

In some possible embodiments of the control unit, the supply source 200 of the electronic circuit can consist of a set of at least two batteries, these two batteries then being connected electrically in series.

The cover 211 of the housing includes a manual pressure zone 220, which has some degree of flexibility, in that it comprises, for example, a zone of reduced thickness of the cover 211, the latter being made in a suitable plastics material. An interrupter 216, of the push-button type, is located below the manual pressure zone 220 of the cover 211. The interrupter 216 is actuated by the user through the pressure zone 220. In this connection, when the user exerts pressure, with a finger 221, on the manual pressure zone 220 of the housing cover 211, the zone 220 is depressed and actuates the push button interrupter 216, thus closing an electric circuit that includes the electronic circuit of the radio control unit, together with its source 200. This closing of the electronic circuit causes the control signal to be emitted.

As was described earlier herein with reference to FIG. 1, the problem encountered is that of singularity of the point of contact between the lower face of the battery and the corresponding terminal 202 of the printed circuit. The conventional reaction of a person familiar with the art consists in trying to make the surfaces defining this point of contact as flat as possible, while increasing the potential contact surface area between the battery and the terminal, for example by defining a diameter for the terminal which is at least as large as the diameter of the battery, which is generally circular in shape.

In the arrangement here described, by contrast, use is made of the fact that the surface of the battery has at least one projecting point. Instead of any attempt being made to flatten the surface, advantage is taken of the fact that this projecting point actually comprises the apex of a local convex curvature. In addition, the novel principle embodied here consists in defining a particular structure, for the collector terminal of the printed circuit, which is less demanding to make industrially than a perfectly flat surface.

Figures 3A, 3B:
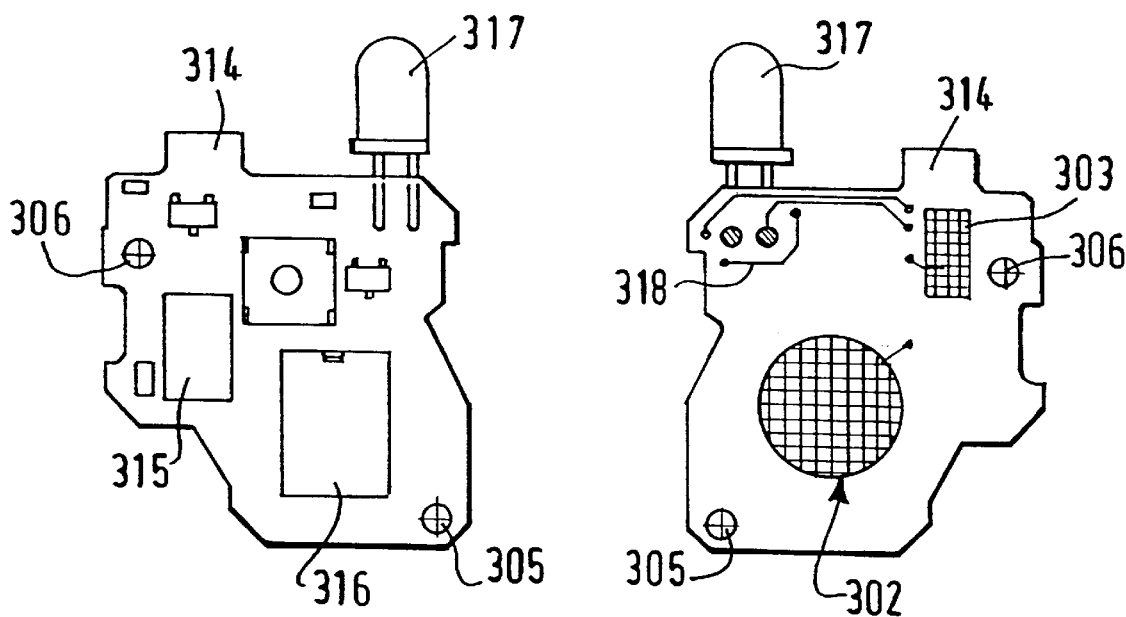
FIG. 3 shows, in FIG. 3a one side and in FIG. 3b the other side, of one electronic circuit according to the invention, illustrating its layout.

The two faces of a printed circuit, in one embodiment of the invention, are shown in FIGS. 3*a* and 3*b* respectively. This printed circuit is adapted to be fitted in a radio control unit housing as shown in FIG. 2, in place of the printed circuit 214 in that Figure. The double faced printed circuit board shown in FIG. 3 has a first face, shown in FIG. 3*a*, which carries, in particular, electronic components such as the components 315 and 316, electrical conductive strips (not shown), and the infra-red diode 317 for emitting the control signal in the infra-red spectrum. The second face of the circuit board (shown in FIG. 3*b*) carries conductive strips 318 and the electrical supply or collector terminals 302 and 303. Holes 305 and 306 enable the printed circuit to be positioned and retained in the closed housing (which is not shown in FIGS. 3*a* and 3*b*). The various conductive strips provide electrical connection between the components of the circuit, and between the terminals 302 and 303 and the components of the circuit.

If reference is made to the radio control unit shown in FIG. 2, the printed circuit of FIG. 3 is mounted with its first face (FIG. 3*a*) facing upwardly, that is to say with the components 315, 316 facing upwardly. The other face (FIG. 3*b*) therefore faces downwards, so that the battery 200 lies in facing relationship with the negative supply terminal 302.

It can be seen from FIG. 3*b* that the supply terminals 302 and 303, and in particular the negative supply terminal 302 which is arranged to make contact with the lower face of the battery, have a grid structure, otherwise referred to as a network structure or grille structure.

In a preferred embodiment, the collector tongue which has the reference numeral 222 in FIG. 2, and which provides permanent electrical contact between the lower face of the battery 200 and the positive supply terminal 303 of the printed circuit, is not soldered to the latter. On the contrary, it is disposed within a seating in the housing, and is held in permanent contact with the terminal 203 due to its elastic construction, which gives rise to a spring force when the housing is closed.

This feature illustrates the fact that the principle of using a grid structure for a collector terminal is applicable, not only to the case in which there is direct contact with a face of a battery, but also to any type of device for making contact between two mechanical components to establish an electrical connection.

In a preferred embodiment, the supply terminals are made in the same way, and at the same time, as the conductive strips 318, during a step in the manufacturing process which is very carefully controlled for making the printed circuit. In this connection, it is sufficient to design, either positively or negatively according to the particular technology used for the printed circuit, a mask that incorporates the grid pattern adopted in the particular case, and to expose, through this mask, a double-faced circuit board which is initially coated uniformly with a conductive metal. In this embodiment, the conductive metal used is an alloy of nickel and gold.

During a further exposure step, the conductive metal is removed in the portions that were exposed, thus revealing the grid structure of the contact terminals of the printed circuit. These latter are therefore not smooth, but, on the contrary, they comprise a network of cavities or recesses corresponding to the grids thus formed.

In this regard, the grids shown in FIG. 3*b* are grids of perpendicular straight lines, with each cavity or recess being substantially in the form of a square. However, it will be understood that, without departing from the scope of the present invention, it is possible to make other types of grid, for example a grid having cavities in the form of lozenges or in other forms.

Practical tests have shown that a contact terminal having the grid structure described above gives much better results than those in which a smooth contact terminal is employed, in that it enables the radio control unit to be manually actuated with a considerably increased tally of successful emissions.

Figure 1:
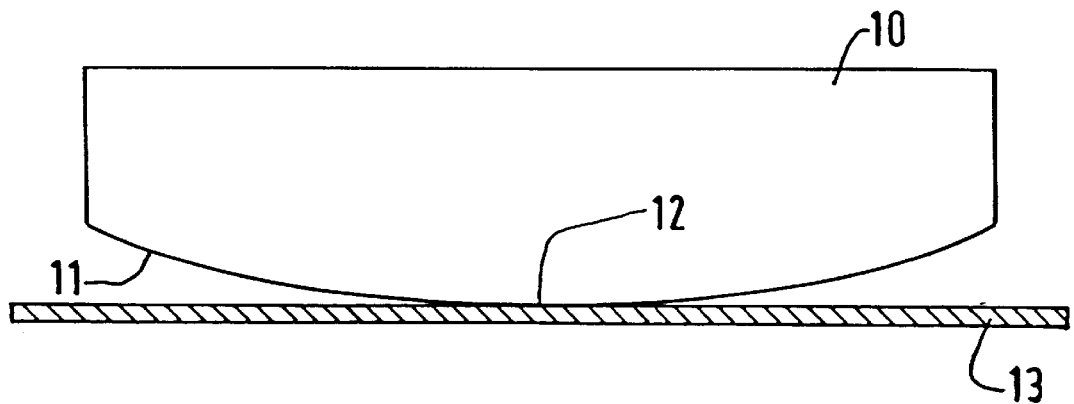
FIG. 1, already described above, shows a battery according to the present state of the art.
Figure 4:
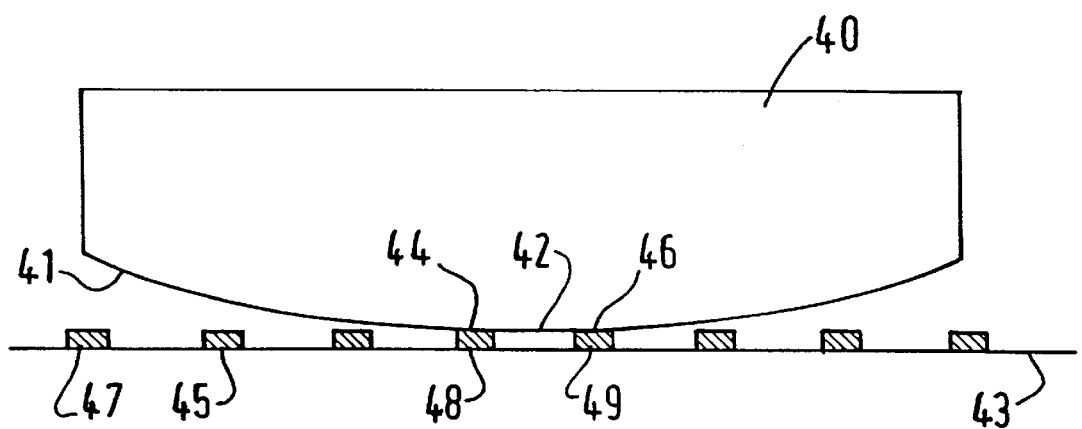
FIG. 4 is a view in cross section of the zone of contact between the battery and the collector terminal, the latter being in the form of a grid according to the invention.

Reference is now made to FIG. 4, which is to some extent derived from the diagram of FIG. 1 showing the prior art. FIG. 4 enables the basis of the improvement afforded by the present invention to be understood. In this connection, FIG. 4 shows a cross section of the contact zone between the lower surface 41 of the battery 40 and the terminal of the printed circuit 43 on which the grid is defined, in the plane of the cross section, by a network of teeth 45, 47.

The same hypothesis is made here as was made above with reference to FIG. 1, that is to say the surface characteristics are defined, at least locally, by the presence of a convex curvature of the lower surface 41 of the battery 40, with, in consequence, the presence of at least one apex, or projecting point, 42 in that zone of the surface 41.

Due to manufacturing and fitting tolerances, and also due to the direction (which may be variable) of the pressure exerted on the battery during closing of the cover 211 on to the base 210 of the housing, when the battery is pressed against the printed circuit collector terminal, it is held in place once it reaches a stable engagement against the grid network of the collector terminal.

It will be understood that the projecting point 42 tends to penetrate into a recess defined by the grid network of the collector terminal, in the way that can be seen in the cross sectional plane of FIG. 4. The surface of the battery then rests on the collector terminal, not through the apex 42 but through two points 44 and 46 located on teeth or ridges 48 and 49 of the grid, on either side of the recess in which the apex 42 has settled.

In practice, due to the two-dimensional structure of the surface of the contact terminal and that of the battery, there are a plurality of contact points which are located on the periphery of the apex 42, and which are distributed approximately on the edge of one grid line of the contact terminal of the printed circuit. It will be seen that the nature of the contact set up in this way enables the passage of current to be better than in the case of a point contact, or virtual point contact, made directly by the apex 42. This explains the improved output which has been found in practical tests, in which manual pressures that were effectively followed by emission of the control signal were compared with the total number of tests carried out.

What is claimed is:

1. An electrical contact for an electronic circuit consisting essentially of a plurality of electronic components, electrical connecting means coupling said components with the electrical contact and a substantially flat contact surface on the electrical contact defining a grid structure for selectively establishing direct pressure electrical communication with said electrical connecting means.

2. An electrical according to claim 1, wherein said grid structure defines a square grid.

3. An electrical contact according to claim 1 further consisting essentially of a printed circuit board, wherein said electrical connecting means has a plurality of conductive strips formed on said printed circuit board.

4. An electrical according to claim 3, wherein the electrical contact and said conductive strips are made of a nickel-gold alloy.

5. An electronic circuit, comprising a printed circuit including conductive strips, electronic components coupled to the conductive strips, and a closable housing protectively containing said printed circuit, at least one electrical contact having a substantially flat contact surface defining a grid structure on the electrical contact for establishing electrical communication with said printed circuit.

6. An electronic circuit according to claim 5, having a battery with a positive pole and a negative pole, at least one of said poles being in electrical communication with said grid structure.

7. An electronic circuit comprising a printed circuit including conductive strips, electronic components coupled to the conductive strips, a closable housing protectively containing said printed circuit, and at least one electrical contact having a substantially flat contact surface defining a grid structure on the electrical contact for establishing electrical communication with said electronic components wherein said at least one electrical contact has two collector terminals, a first one of said terminals for contact with said negative battery pole, and a second one of said terminals for contact with said positive battery pole.

8. An electronic circuit according to claim 7, wherein said housing has a base defining a seating, said battery being retained in said seating and having a first face in permanent contact with said first terminal.

9. An electronic circuit according to claim 8, wherein said battery further includes a second face, the electronic circuit further including a collector tongue having two ends, with one of said ends disposed between said base and said second battery face making permanent contact with said second battery face, said other tongue end being in permanent contact with said second collector terminal.

10. A radio control emitter for opening and closing closable elements of a vehicle, comprising a printed circuit including conductive strips, electronic components coupled to said conductive strips, and a closable housing protectively containing said printed circuit, at least one collector terminal, and a substantially flat contact surface defining a grid structure on the collector terminal for establishing electrical contact with said printed circuit.

* * * * *

UNITED STATES PATENT AND TRADEMARK OFFICE
CERTIFICATE OF CORRECTION

PATENT NO. : 5,844,173

DATED : December 1, 1998

INVENTOR(S) : Denis Etienne

It is certified that error appears in the above-identified patent and that said Letters Patent is hereby corrected as shown below:

In Column 7,

In Claim 2, line 4, after "electrical" insert --contact--.

In Claim 4, line 10, before "according" insert --contact--.

Signed and Sealed this

Eleventh Day of May, 1999

*Attest:*

Q. TODD DICKINSON

*Attesting Officer*   *Acting Commissioner of Patents and Trademarks*